United States Patent
Mendes Alves Da Costa et al.

(10) Patent No.: US 9,602,246 B2
(45) Date of Patent: Mar. 21, 2017

(54) METHOD AND APPARATUS FOR FEEDBACK-BASED REAL-TIME NETWORK CODING

(75) Inventors: Rui Filipe Mendes Alves Da Costa, Sao Joao Ovr (PT); Diogo Joao De Sousa Ferreira, vila Nova de Gaia (PT); Joao Francisco Cordeiro De Oliveira Barros, Porto (PT)

(73) Assignee: UNIVERSIDADE DO PORTO, Porto (PT)

(*) Notice: Subject to any disclaimer, the term of this patent is extended or adjusted under 35 U.S.C. 154(b) by 285 days.

(21) Appl. No.: 14/342,584

(22) PCT Filed: Sep. 3, 2012

(86) PCT No.: PCT/IB2012/054544
§ 371 (c)(1),
(2), (4) Date: Jul. 7, 2014

(87) PCT Pub. No.: WO2013/030811
PCT Pub. Date: Mar. 7, 2013

(65) Prior Publication Data
US 2014/0226677 A1    Aug. 14, 2014

(30) Foreign Application Priority Data
Sep. 2, 2011 (PT) .......................... 105875

(51) Int. Cl.
*H04L 12/865* (2013.01)
*H04L 1/00* (2006.01)
(Continued)

(52) U.S. Cl.
CPC .......... *H04L 1/0083* (2013.01); *H03M 13/13* (2013.01); *H03M 13/615* (2013.01);
(Continued)

(58) Field of Classification Search
CPC ... H04L 1/0083; H04L 1/1877; H04L 1/1887; H04L 1/0076; H04L 1/1838;
(Continued)

(56) References Cited

U.S. PATENT DOCUMENTS

| 7,408,938 B1 | 8/2008 | Chou et al. |
| 2009/0019505 A1* | 1/2009 | Gopalakrishnan .... H04L 1/0001 725/109 |
| 2010/0046371 A1 | 2/2010 | Sundararajan et al. |

OTHER PUBLICATIONS

Sachin Katti et al.: "XORs in the Air: Practical Wireless Network Coding"; IEEE/ACM Transactions on Networking, vol. 16, No. 3, Jun. 2008; pp. 497-510.
(Continued)

*Primary Examiner* — Joshua Kading
(74) *Attorney, Agent, or Firm* — Sughrue Mion, PLLC

(57) ABSTRACT

The present subject-matter relates to transmitting a real-time data stream, namely simultaneously to multiple receivers over unreliable networks (e.g. wireless multicast), in a timely and reliable manner, in particular to a method, apparatus and computer program product for feedback-based real-time network coding. It is disclosed a computer-implemented method for a transmitting node, a receiving node, and an intermediate node of feedback-based real-time network coding from a transmitter and to one or more receivers, in particular comprising a linear combination of packets from the transmitter; determining whether the received linear combination of packets is linearly independent of previous linear combinations of packets; determining the validity of a priority level of the packets; determining validity of the deadline of the packets; determining whether a packet is to be removed from a transmit queue, and if determined removing it. There are also disclosed said transmitting, receiving, and intermediate nodes.

13 Claims, 8 Drawing Sheets

(51) Int. Cl.
*H03M 13/13* (2006.01)
*H04L 1/18* (2006.01)
*H03M 13/00* (2006.01)

(52) U.S. Cl.
CPC .......... *H04L 1/0076* (2013.01); *H04L 1/1838* (2013.01); *H04L 1/1877* (2013.01); *H04L 1/1887* (2013.01); *H04L 47/6275* (2013.01); *H03M 13/6522* (2013.01)

(58) Field of Classification Search
CPC ..... H04L 1/004; H04L 1/0041; H04L 1/0061; H04L 1/0078; H04L 1/009; H04L 49/55–49/557; H04L 47/6275; H03M 13/13; H03M 13/47; H03M 13/611; H03M 13/616; H03M 13/615; H03M 13/6502; H03M 13/6525; H03M 13/6527; H03M 13/653; H03M 13/6544; H03M 13/6577; H03M 13/6522
See application file for complete search history.

(56) References Cited

OTHER PUBLICATIONS

Joao Barros et al.: "Effective Delay Control in Online Network Coding"; IEEE INFOCOM; 2009; pp. 208-216.
Nikolaos Thomos et al.: "Prioritized Distributed Video Delivery With Randomized Network Coding"; IEEE Transactions on Multimedia, vol. 13, No. 4; Aug. 2011; pp. 776-787.

\* cited by examiner

METHOD AND APPARATUS FOR FEEDBACK-BASED REAL-TIME NETWORK CODING

TECHNICAL FIELD

The present subject-matter relates to transmitting a real-time data stream, namely simultaneously to multiple receivers over unreliable networks (e.g. wireless multicast), in a timely and reliable manner, in particular to a method, apparatus and computer program product for feedback-based real-time network coding.

SUMMARY

A method, apparatus and computer program product for feedback-based real-time network coding is presented. In one embodiment, a transmitting node determines the priority level for each packet in a transmit queue as a function utilizing the deadline of the packet and uses the priority levels of the packets to determine a linear combination of packets to transmit from a transmit queue. The transmitter determines whether a packet can be removed from the transmit queue, wherein a packet is removed from the transmit queue if its deadline has passed and is not removed from the transmit queue if its deadline has not passed.

BACKGROUND ART

Transmitting a real-time data stream simultaneously to multiple receivers over unreliable networks (e.g. wireless multicast) in a timely and reliable manner is a challenging problem because different receivers experience different packet losses and therefore request for different packets to be retransmitted. In the case of unicast sessions, reliable data delivery is often implemented by means of positive acknowledgments (ACK) after each transmitted packet and some form of Automatic Repeat reQuest (ARQ) mechanism. If an ACK does not arrive within a certain time interval, the sender considers that the packet was lost by the receiver and initiates its retransmission. In multicast scenarios, where data must be transmitted simultaneously to several receivers, traditional ARQ aimed at satisfying individual requests from each receiver becomes inefficient. The reason is that while a packet is retransmitted to a specific receiver, all receivers that do not need that particular retransmission stay idle for a time period, which makes it impossible to meet stringent real-time constraints. Moreover, the use of ACKs to ensure reliable data delivery in the case of multicast with feedback is not straightforward, since the sender must wait for the ACKs of each receiver before transmitting any data. This implies additional delays in data delivery and requires receiver coordination, particular if the receivers are sharing a common feedback channel. Case in point, the IEEE 802.11 standard foresees that multicast data be transmitted in open-loop fashion, i.e. without any feedback mechanism. This makes it impossible to provide real-time guarantees for applications such as live video streaming or industrial control.

Others have presented solutions in which the transmitter is given the ability to code across packets. Fountain Codes, which present a throughput optimal solution to multicast over packet erasure channels, have been extended to cope with unequal error protection and real-time requirements. One solution for video streaming uses unequal error protection in a block-based coding scheme to increase the probability of delivering certain frames that are more important than others. Another solution uses a sliding coding window, such that the transmitter sends the oldest packet in the window and a recovery coded transmission before the coding window moves forward.

Network coding allows the transmitter and intermediate nodes to perform algebraic operations on a set of packets, thereby generating linear combinations of packets that are sent to the receivers. In feedback based online network coding, the linear combinations of packets are functions of notifications sent by the receivers over one or more feedback channels. In the COPE protocol, intermediate nodes satisfy the requests of several receivers simultaneously by combining packets from different flows. For the case when all packets are to be delivered to all receivers there exist coding schemes capable of producing linear combinations that can be immediately decodable by a large number of receivers. Likewise, solutions exist to ensure that receivers with poorer channel conditions can still decode at least some of the packets. It has been shown that minimizing the number of packets that miss their deadlines in the case of multicast with stringent end-to-end delay is NP-hard.

However, the present embodiments enable the transmitter to offer real-time guarantees by prioritizing the packets in the transmit queue as a function of the packet deadlines and the available (possibly partial) feedback from the receivers, thereby producing linear combinations that allow the receivers to decode the right packet at the right time, i.e. before the packet deadline has passed. The presently disclosed coding module is able to make coding decisions in the presence of incomplete feedback information, including sending uncoded packets whenever necessary. It is further able to maximize the number of receivers that can decode a given packet immediately upon reception of a sent linear combination.

DISCLOSURE OF THE INVENTION

Conventional mechanisms such as those explained above suffer from a variety of deficiencies. ARQ based solutions for multicast that transmit individual packets for individual receivers are very well studied and known to result in delays that are too severe for applications with stringent real-time constraints. Fountain codes fail to meet timely delivery requirements, because coding is done in blocks and receivers must receive several coded packets until they are able to recover the sent data. Moreover, fountain codes were originally designed as end-to-end solutions that do not extend readily to network scenarios in which intermediate nodes can process incoming data flows. General online network coding solutions do not provide real-time guarantees, because they do not take packet deadlines into consideration when generating the linear combinations to be sent to the receivers. Other well known solutions that exploit feedback to make coding decisions assume perfect and timely knowledge of the needs of each receiver, which is not always available given the physical characteristics of the communication medium, e.g. congested networks that have latency and lose feedback packets or noisy wireless channels that suffer from noise and interference.

Embodiments of the invention significantly overcome such deficiencies and provide mechanisms and techniques that provide a new approach to real-time multicast over lossy links using feedback-based network coding. In terms of implementation, the methods can be easily integrated in the prevalent TCP/IP protocol stack, which makes it simple to deploy in existing systems. A technique is described in which the transmitter uses packet deadlines and partial feedback to generate linear combinations that are useful to the largest possible number of receivers. Upon receiving the recovery packets, the receivers can decode the packets in a timely manner and thereby meet the real-time constraints of the application.

In a particular embodiment of a method in which a transmitting node performs operations for providing feedback-based real-time network coding, the method includes receiving notifications of one or more receivers that one or more packets were missed. The method further includes determining the priority level for each packet in a transmit queue. The priority level therein is a function utilizing the deadline of the packet and any information received via notifications from the receivers that one or more packets were missed. Additionally, the method includes determining a linear combination of packets to transmit from the transmit queue based upon the packets that were missed by one or more receivers and the priority levels of the packets. The method further includes transmitting the linear combination of packets.

In another particular embodiment of a method in which a receiving node performs operations for providing feedback-based real-time network coding, the method includes receiving a linear combination of packets. The method further includes determining whether the linear combination of packets is linearly independent of previously received linear combinations of packets and therefore conveys new information. Additionally, the method includes determining whether a packet can be decoded using the received linear combination of packets and previously received linear combination of packets. The method further includes determining whether the priority level of the packet is valid, wherein determining the priority level is equivalent to checking if the deadline has not passed. In addition, the method includes determining whether one or more packets were missed and, when this is the case, sending a notification with the identifiers of the packets that were missed.

Other embodiments include a computer readable medium having computer readable code thereon for providing feedback-based real-time network coding at a transmitting node. The computer readable medium includes instructions for receiving notifications of one or more receivers that one or more packets were missed. The computer readable medium also includes instructions for determining the priority level for each packet in a transmit queue. The priority level therein is a function utilizing the deadline of the packet and any information received via notifications from the receivers that one or more packets were missed. The computer readable medium further includes instructions for determining a linear combination of packets to transmit from the transmit queue based upon the packets that were missed by one or more receivers and the priority levels of the packets. In addition, the computer readable medium further includes instructions for transmitting the linear combination of packets.

Still other embodiments include a computer readable medium having computer readable code thereon for feedback-based real-time network coding at a receiving node. The computer readable medium includes instructions for receiving a linear combination of packets. The computer readable medium further includes instructions for determining whether the linear combination of packets is linearly independent of previously received linear combinations of packets and therefore conveys new information. Additionally, the computer readable medium includes instructions for determining whether a packet can be decoded using the received linear combination of packets and previously received linear combination of packets. The computer readable medium further includes instructions for determining whether the priority level of the packet is valid, wherein determining the priority level is equivalent to checking if the deadline has not passed. In addition, the computer readable medium includes determining whether one or more packets were missed and, when this is the case, sending a notification with the identifiers of the packets that were missed.

Yet another embodiment includes a computer readable medium having computer readable code thereon for providing feedback-based real-time network coding at an intermediate node. The computer readable medium includes instructions for receiving a linear combination of packets. The computer readable medium further includes instructions determining whether the linear combination of packets is linearly independent of previously received linear combinations of packets and therefore conveys new information. Additionally, computer readable medium includes instructions for determining whether a packet can be decoded using the received linear combination of packets and previously received linear combination of packets. The computer readable medium further includes instructions for determining whether the priority level of the packet is valid, wherein determining the priority level is equivalent to checking if the deadline has not passed. In addition, the computer readable medium includes instructions for determining a linear combination of packets to transmit from the transmit queue based upon the priority levels of the packets. The computer readable medium further includes instructions for transmitting the linear combination of packets.

Some embodiments transmit said linear combination of packets including coding coefficients in the header of the linear combination of packets.

Still other embodiments include a computerized device, configured to process all the method operations disclosed herein as embodiments of the invention. In such embodiments, the computerized device includes a memory system, a processor, communications interface in an interconnection mechanism connecting these components. The memory system is encoded with a process that provides network coding based flow control as explained herein that when performed (e.g. when executing) on the processor, operates as explained herein within the computerized device to perform all of the method embodiments and operations explained herein as embodiments of the invention. Thus any computerized device that performs or is programmed to perform up processing explained herein is an embodiment of the invention.

Other arrangements of embodiments of the invention that are disclosed herein include software programs to perform the method embodiment steps and operations summarized above and disclosed in detail below. More particularly, a computer program product is one embodiment that has a computer-readable medium including computer program logic encoded thereon that when performed in a computerized device provides associated operations providing network coding based flow control as explained herein. The computer program logic, when executed on at least one processor with a computing system, causes the processor to perform the operations (e.g., the methods) indicated herein as embodiments of the invention. Such arrangements of the invention are typically provided as software, code and/or other data structures arranged or encoded on a computer readable medium such as an optical medium (e.g., CD-ROM), floppy or hard disk or other a medium such as firmware or microcode in one or more ROM or RAM or PROM chips, or FPGA or other reconfigurable, programmable or field-programmable integrated circuit, or as an Application Specific Integrated Circuit (ASIC) or as downloadable software images in one or more modules, shared libraries, etc. The software or firmware or other such configurations can be installed onto a computerized device to cause one or more processors in the computerized device to perform the techniques explained herein as embodiments of the invention. Software processes that operate in a collection of computerized devices, such as in a group of data communications devices or other entities can also provide the system of the embodiments of the invention. The system of the embodiments of the invention can be distributed between many software processes on several data communications devices, or all processes could run on a small set of dedicated computers, or on one computer alone.

It is to be understood that the embodiments of the invention can be embodied strictly as a software program, as software and hardware, or as hardware and/or circuitry alone, such as within a data communications device.

Note that each of the different features, techniques, configurations, etc. discussed in this disclosure can be executed independently or in combination. Accordingly, the present invention can be embodied and viewed in many different ways. Also, note that this summary section herein does not specify every embodiment and/or incrementally novel aspect of the present disclosure or claimed invention. Instead, this summary only provides a preliminary discussion of different embodiments and corresponding points of novelty over conventional techniques. For additional details, elements, and/or possible perspectives (permutations) of the invention, the reader is directed to the disclosure below and corresponding figures of the present disclosure as further discussed below.

BRIEF DESCRIPTION OF DRAWINGS

The foregoing will be apparent from the following more particular description of embodiments of the invention, as illustrated in the accompanying drawings in which like reference characters refer to the same parts throughout the different views. The figures provide embodiments for illustrating the description and should not be seen as limiting the scope of invention.

FURTHER DISCLOSURE AND MODES FOR CARRYING OUT THE INVENTION

Figure 1:
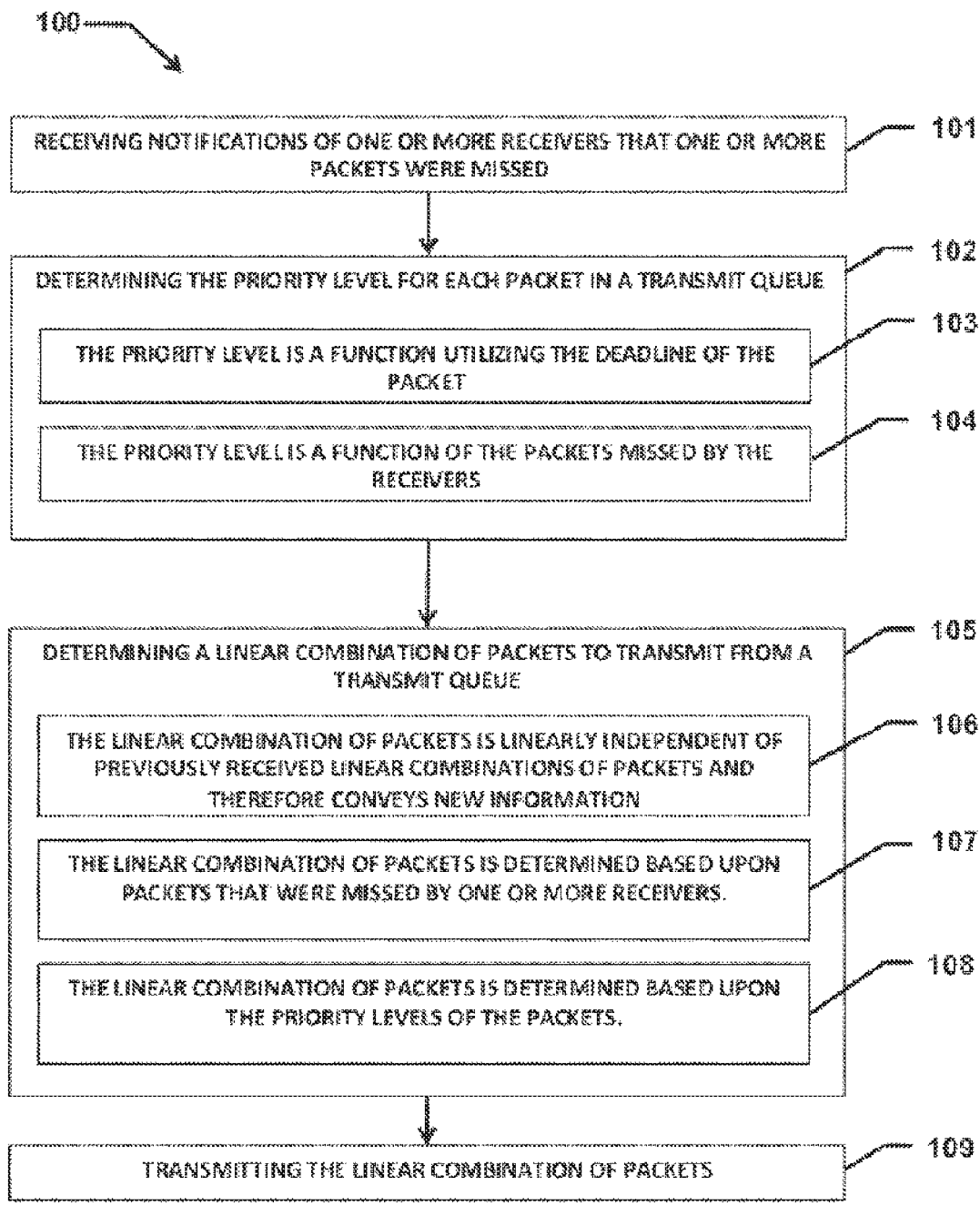
FIG. 1 comprises a flow diagram of a particular embodiment of a method of providing feedback-based real-time network coding in a transmitting node in accordance with embodiments of this invention.

Reliable real-time transmission of a data stream to multiple receivers simultaneously over a lossy communications medium can be achieved by retransmitting coded packets that can be used by multiple receivers. This is possible even when the transmitter only has partial information about the packets lost by each of the receivers.

The present system model assumes that the transmitter communicates with N receivers over a broadcast packet erasure channel (e.g. an IEEE 802.11 multicast connection). More precisely, each transmitted packet is correctly received at receiver i with probability $1-\epsilon_i$, for $i=1, \ldots, N$. It is further possible that the communication medium is half-duplex, which means that the transmitter and the receivers can transmit and receive, but not perform both simultaneously.

The transmitter keeps a transmit queue that contains packets whose identifiers are set sequentially. Assuming that the application has stringent delay requirements, each packet is assigned a specific deadline representing the time instant after which the packet becomes useless to every receiver. Packets in the transmit queue are discarded once their deadline has passed. The transmitter keeps a list of packets decoded by each receiver. The list is updated using estimation as well as feedback information from the receivers sent in the form of notifications, as described below. For each receiver $R_i$ and each source packet $p_j$, the sender also stores the number $T_j^i$ of linear combinations transmitted since the last notification received from $R_i$. The transmitter uses the list of packets decoded by each receiver and the number of transmitted linear combinations since the last notification to determine a linear combination to send to the receivers. The transmitter sends this linear combination.

Receivers can use the fact that packets are numbered sequentially to detect missing packets. Each receiver is able to inform the transmitter of its reception status (i.e. which packets has not received) by sending notifications as feedback packets through a feedback channel. To be able to decode newly received linear combinations, each receiver stores each decoded packet in a decoding buffer. Packets in the decoding buffer are discarded once their deadline has passed. Since the transmitter sends linear combinations of packets, it is considered that with respect to a given receiver, each received linear combination is innovative if it is linearly independent from all the linear combinations available at the receiver. Further, it is said that a linear combination is immediately decodable if it is innovative and the receiver can decode a new packet. A linear combination that is not innovative is immediately discarded.

In the following it is introduced the notion of critical packet. Informally, a packet becomes critical when the probability that the packet is delivered successfully to all receivers within a given time frame is below a given threshold.

Definition 1 Let $Z^i(t)$ denote the event of a packet being successfully received in t transmissions by receiver $R_i$. Let $T_j^i$ denote the number of linear combinations, which were transmitted since the last feedback received from $R_i$ and allow receiver $R_i$ to decode $p_j$ if received correctly. It is said that a source packet $p_j$ is critical if $$P(\cap_i Z^i(k_j+T_j^i)) \leq \alpha \qquad \text{(Eq.1)}$$

where $k_j$ is the number of transmissions available until the deadline of the packet $p_j$.

| Algorithm 1 |
| --- |
| 1: if there is a critical packet in the buffer then |
| 2:     Run Critical Recovery Algorithm |
| 3: else |
| 4:     if a new packet was placed in the transmit queue then |
| 5:         Transmit the new packet |
| 6:     else |
| 7:         Run Recovery Algorithm |
| 8:     end if |
| 9: end if |

Notice that $T_j^i$ appears in Eq. 1 because the source does not know whether the transmissions that occurred after the last received feedback from receiver $R_i$ reached this receiver or not. Hence, these transmissions must be added to the set of transmissions that can provide packet $p_j$ to receiver $R_i$.

The invention hereby disclosed includes a method that prioritizes the delivery of critical packets and allows the receivers to recover from packet losses in a timely manner. If the transmit queue contains a critical packet, the transmitter uses a Critical Recovery Algorithm to determine a linear combination to send, which allows the receivers who lost said critical packet to recover it and other receivers to recover other packets that they are missing.

If there is no critical packet in the transmit queue, then the transmitter checks if there are packets in the transmit queue that were never transmitted before. If this is the case, the transmitter sends the older of such packets. The goal with this stage is to avoid delaying the transmission of recently generated packets to recover from older packet losses. Otherwise, this would penalize the receivers that did not lose those packets. Moreover, such transmission is throughput optimal, since it is useful for every receiver. If the transmit queue does not have critical packet nor a new packet, the transmitter runs the Recovery Algorithm. In this case, the goal is to help a large set of receivers to recover from previous packet losses. In the following, it is provided a detailed description of these algorithms.

To describe the two coding algorithms used in Algorithm 1, it must be first set some notation. The critical packet is denoted by $p_C$. In case multiple critical packets exist, $p_C$ is the packet with the highest probability of breaking its deadline, i.e. $p_C$ is the packet that maximizes the left hand side of Eq. 1.

Let B denote the set of packets that are in the buffer and thus available for the encoder. It is denoted the set of receivers that have not decoded packet p by U(p), and A(i) denotes the set of packets already decoded by receiver i (and that are in B). Finally, if $C=\{p_1, \ldots, p_n\}$ is a subset of B, it is denoted by idec(C) the set of receivers that are able to immediately decode a new source packet from the linear combination $p_1 \oplus \ldots \oplus p_n$. |idec(C)| denotes the number of such receivers.

| Algorithm 2 Recovery Algorithm |
| --- |
| 1:     $C \leftarrow \{\}$ |
| 2:     $q \leftarrow 0$ |
| 3:     $p^* \leftarrow \operatorname{argmax}_{p \in B}|\text{idec}(\{p\})|$ |
| 4:     while $|\text{idec}(C \cup \{p^*\})| > q$ do |
| 5:         $C \leftarrow C \cup \{p^*\}$ |
| 6:         $q \leftarrow |\text{idec}(C \cup \{p^*\})|$ |
| 7:         $p^* \leftarrow \operatorname{argmax}_{p \in B}|\text{idec}(C \cup \{p\})|$ |
| 8:     end while |
| 9:     if $|\text{idec}(C)| \geq M$ then |
| 10:        transmit $c = \bigoplus_{p_i \in C} p_i$ |
| 11:    else |
| 12:        Do not transmit |
| 13:    end if |

As mentioned earlier, when neither a new packet nor a critical packet are present at the transmit queue, the transmitter runs the Recovery Algorithm (Algorithm 2) to construct a linear combination that provides immediately decodable packets to a large set of receivers in a single transmission. The goal is to construct a set of source packets C that maximizes |idec(C)|, over all possible sets $C \subset B$. However, if n is the number of packets in B, it is needed to search among $2^n-1$ possible subsets of B to find the solution, which is known to be a NP-Hard problem. Hence, it is used a heuristic to solve such problem.

The set C represents the set of packets that will be jointly encoded to build the linear combination to be transmitted. The Recovery algorithm starts by selecting the packet in the transmit queue that maximizes the number of receivers that have not decoded it. This corresponds to maximizing |idec({p})| over all packets p. After this first choice, the algorithm evolves by adding to C the packet in the transmit queue that, when added with the previously chosen packets, maximizes the number of receivers that immediately decode such linear combination ($p^* \leftarrow \operatorname{argmax}_{p \in B}|\text{idec}(C \cup \{p\})|$), provided it increases the number of such receivers when compared with the previous choice ($|\text{idec}(C \cup \{p^*\})| > q$). Finally, to control the number of recovery packets that are transmitted, the algorithm only transmits a packet if it is immediately decodable for at least M receivers, where M is a tunable parameter.

If a critical packet is detected, the transmitter runs the Critical Recovery Algorithm (Algorithm 3). The goal is to ensure that receivers that lost the critical packet are able to decode it assuming that no erasure occurs. Here, the transmitter follows a strategy similar to Algorithm 2 albeit with some crucial differences. The first packet to be added to the linear combination is the critical packet itself ($p^* \leftarrow p_C$). Given that receivers that lost the critical packet must decode it from the constructed linear combination, the transmitter is now constrained to choose packets that have been decoded by all such receivers, i.e. packets in the set $A^C = \cap_{i \in U(p_C)} A(i)$. Within this set, the algorithm then evolves as Algorithm 2 to construct the linear combination. The constructed linear combination is transmitted irrespective of the number of receivers that can decode it immediately, in contrast with Algorithm 2. In this stage, the goal is to ensure that the deadline of the critical packet is not broken at some receiver.

| Algorithm 3 Critical Recovery Algorithm | |
|---|---|
| 1: | $C \leftarrow \{\ \}$ |
| 2: | $q \leftarrow 0$ |
| 3: | $p^* \leftarrow p_C$ |
| 4: | $A_C = \bigcap_{i \in U(p_C)} A(i)$ |
| 5: | while $|idec(C \cup \{p^*\})| > q$ do |
| 6: | $C \leftarrow C \cup \{p^*\}$ |
| 7: | $q \leftarrow |idec(C \cup \{p^*\})|$ |
| 8: | $p^* \leftarrow \arg\max_{p \in A_C} |idec(C \cup \{p\})|$ |
| 9: | end while |
| 10: | transmit $c = \bigoplus_{p_i \in C} p_i$ |

Upon correct reception of a linear combination, each receiver checks if it can decode a new packet from the linear combination. If this is the case, the newly decoded packet is added to the decoding buffer. Otherwise, the receiver discards the received linear combination.

Since the transmitter may only have partial feedback from the receivers, it is not immediately aware of the success of a transmission that enables receiver $R_i$ to decode packet $p_j$. Thus, the transmitter does not always know whether $R_i$ decoded $p_j$ or not. To overcome this challenge, the transmitter uses the channel statistics to update the knowledge of the encoder on the decoding state of the receivers, as follows. Let $S_\beta(i)$ be the minimum number of transmissions to ensure that the probability of receiver $R_i$ successfully receiving the transmission is at least $\beta$, i.e. $S_\beta(i) = \min\{k : 1 - \epsilon_i^k \geq \beta\}$. The definition of $T_j^i$ was given above. Finally, to overcome the problem caused by the absence of feedback, the transmitter assumes that packet $p_j$, reported as missing by $R_i$ in its last feedback, was decoded by $R_i$ if and only if $T_j^i \geq S_\beta(i)$.

Research in network coding has shown that there are significant benefits in allowing intermediate nodes to perform network coding operations. An important feature of the technique described above is that it works both when the end hosts perform the coding/decoding on an end-to-end basis and when one or more intermediate nodes perform network coding on the incoming linear combinations.

Flow diagrams of particular embodiments of the presently disclosed methods are depicted in FIGS. 1, 2, 3 and 4. The rectangular elements are herein denoted "processing blocks" and represent computer software instructions or groups of instructions. Alternatively, the processing blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required in accordance with the present invention. It should be noted that many routine program elements, such as initialization of loops and variables and the use of temporary variables are not shown. It will be appreciated by those of ordinary skill in the art that unless otherwise indicated herein, the particular sequence of steps described is illustrative only and can be varied without departing from the spirit of the invention. Thus, unless otherwise stated the steps described below are so unordered meaning that, when possible, the steps can be performed in any convenient or desirable order.

Referring now to FIG. 1, a particular embodiment is shown of a method 100 of providing feedback-based real-time network coding by way of a transmitting node. Method 100 begins with processing block 101 which discloses receiving notifications of one or more receivers that one or more packets were missed. Processing block 102 states determining the priority level for each packet in a transmit queue. As shown in processing block 103, the priority level therein is a function utilizing the deadline of the packet. As further recited in processing block 104 the priority level is a function of the packets missed by the receivers.

Processing block 105 states determining a linear combination of packets to transmit from the transmit queue. As shown in processing block 106 the linear combination of packets is linearly independent of previously received linear combinations of packets and therefore conveys new information. Processing block 107 further discloses that the linear combination of packets is determined based upon packets that were missed by one or more receivers. Processing block 108 recites that the linear combination of packets is determined based upon the priority levels of the packets. Processing block 109 states transmitting the linear combination of packets.

Figure 2:
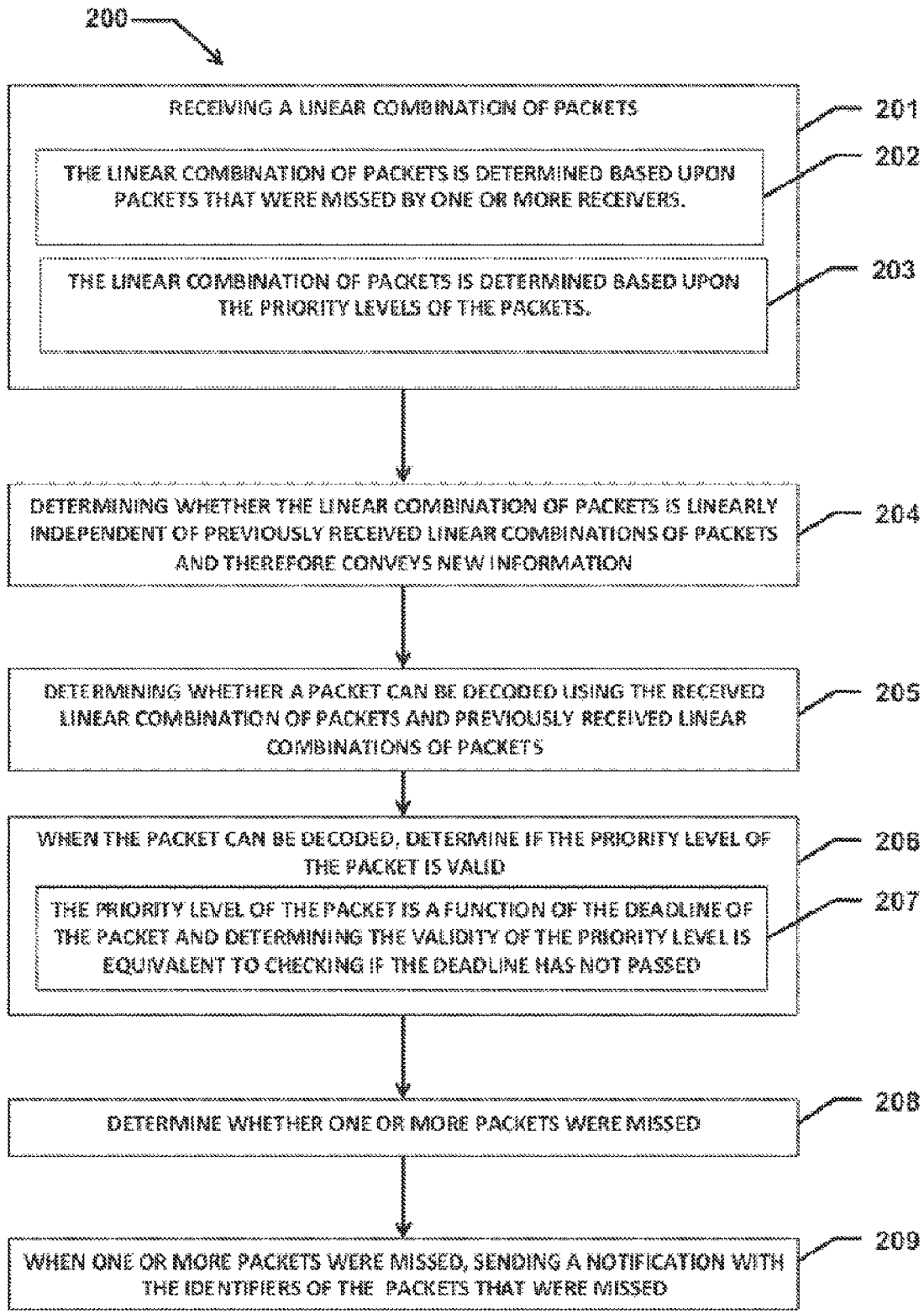
FIG. 2 comprises a flow diagram of a particular embodiment of a method of providing feedback-based real-time network coding in a receiving node in accordance with embodiments of this invention.

Referring now to FIG. 2, a particular embodiment is shown of a method 200 of providing feedback-based real-time network coding by way of a receiving node. Method 200 starts with processing block 201, which discloses receiving a linear combination of packets. Processing block 202 further shows determining whether the linear combination of packets is linearly independent of previously received linear combinations of packets and therefore conveys new information. Processing block 203 recites determining whether a packet can be decoded using the received linear combination of packets and previously received linear combination of packets.

Processing block 204 states determining whether the linear combination of packets is linearly independent of previously received linear combinations of packets and therefore conveys new information. Processing block 205 recites determining whether a packet can be decoded using the received linear combination of packets and previously received linear combinations of packets.

Processing block 206 states when the packet can be decoded, determine if the priority level of the packet is valid. Processing block 207 further shows that the priority level of the packet is a function of the deadline of the packet and determining the validity of the priority level is equivalent to checking if the deadline has not passed. Processing continues with processing block 208, which states determine whether one or more packets were missed. Processing block 209 discloses when one or more packets were missed, sending a notification with the identifiers of the packets that were missed.

Figure 3:
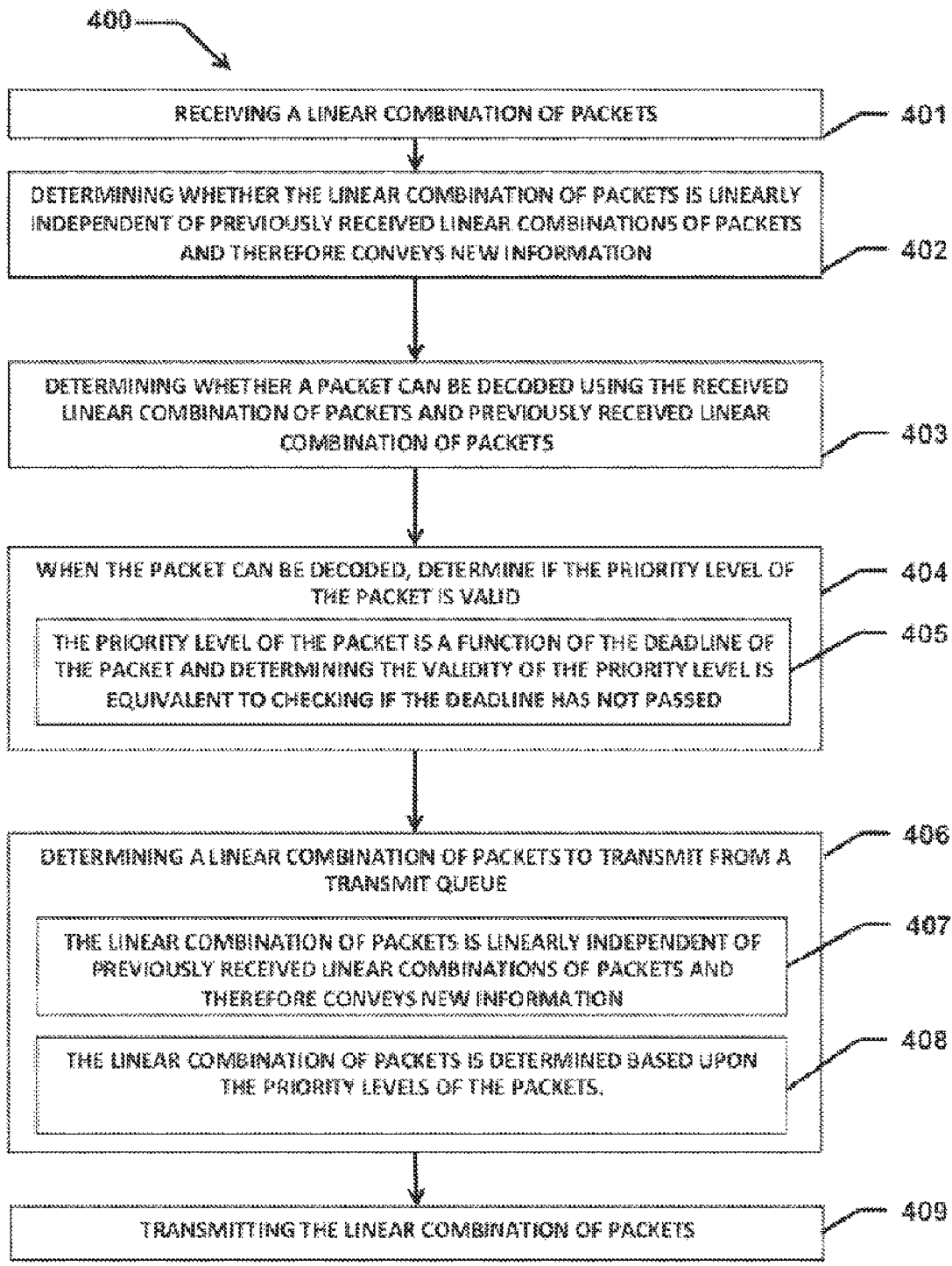
FIG. 3 comprises a flow diagram of a particular embodiment of a method of providing feedback-based real-time network coding in intermediate node in accordance with embodiments of this invention.

Referring now to FIG. 3, a particular embodiment is shown of a method 400 of providing feedback-based real-time network coding by way of an intermediate node. Method 400 starts with processing block 401, which discloses receiving a linear combination of packets. Processing block 402 further shows determining whether the linear combination of packets is linearly independent of previously received linear combinations of packets and therefore conveys new information. Processing block 403 recites determining whether a packet can be decoded using the received linear combination of packets and previously received linear combination of packets.

Processing continues with processing block 404, which states when the packet can be decoded, determine if the priority level of the packet is valid. Processing block 405 further shows that the priority level of the packet is a function of the deadline of the packet and determining the validity of the priority level is equivalent to checking if the deadline has not passed.

Processing block 406 states determining a linear combination of packets to transmit from the transmit queue. As shown in processing block 407 the linear combination of packets is linearly independent of previously received linear combinations of packets and therefore conveys new information. Processing block 408 further discloses that the linear combination of packets is determined based upon packets that the linear combination of packets is determined based upon the priority levels of the packets. Processing block 409 states transmitting the linear combination of packets.

Figure 4:
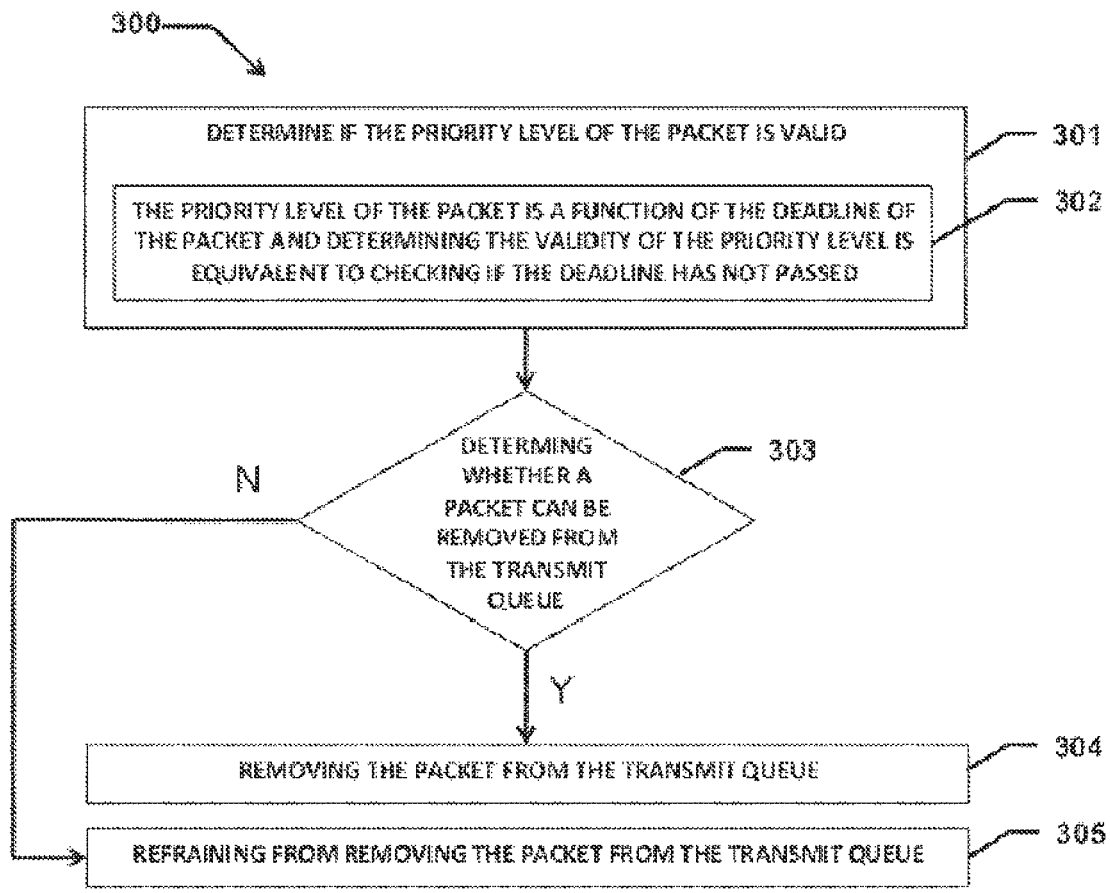
FIG. 4 comprises a flow diagram of a particular embodiment of a method of determining whether a packet can be removed from the transmit queue in accordance with embodiments of this invention.

Referring now to FIG. 4, a particular embodiment is shown of a method 300 of determining whether a packet can be removed from the transmit queue of a node using feedback-based real-time network coding. Method 300 starts with processing block 301, which discloses determine if the priority level of the packet is valid. Processing block 302 further shows that the priority level of the packet is a function of the deadline of the packet and determining the validity of the priority level is equivalent to checking if the deadline has not passed. As shown in decision block 303, a determination is made whether the packet can be removed from the transmit queue. As shown in processing block 304, when the determination is made to remove the packet from the transmit queue then the node removes the packet from the transmit queue. As shown in processing block 305, when the determination is made not to remove the packet from the transmit queue then the node refrains from removing the packet from the transmit queue.

It is now discussed the implementation of the proposed methods and processes over wireless networks that employ the IEEE 802.11 family of standards. The methods assume slotted time and require the nodes to be able to count the number of transmissions that are possible until a certain event occurs. Thus, implementation in IEEE 802.11 wireless networks requires the transmitter to obtain an estimate of the duration of a transmission, which can be computed as follows. Let $\Delta_T$ be the time elapsed from the delivery of a packet to the 802.11 MAC layer until the next announcement of available channel received from the MAC layer. Let $\overline{\Delta}_T$ denote the empiric average of $\Delta_T$. From the perspective of the network layer, $\overline{\Delta}_T$ is the average time necessary to transmit a packet. To implement the notion of critical packet as defined Definition 1, it is necessary that the transmitter know the number of transmissions available until the deadline of the packet $p_j$, denoted by $k_j$. Using the estimated transmission duration $\overline{\Delta}_T$, the transmitter estimates $k_j$ by $k_j = \lfloor \Delta_D / \overline{\Delta}_T \rfloor$, where $\Delta_D$ denotes the time left until the deadline of packet $p_j$.

Another challenge is to estimate the probability of the loss of a certain packet at each receiver. The transmitter can compute such probability empirically from the feedback notifications, in which receivers send the identifiers of the packets they lost. Let $\epsilon_i$ denote the erasure probability for receiver i. In order to compute Eq. 1 from Definition 1, it is useful to make some simplifying assumptions about the statistics of the wireless medium. Assuming that erasures occur independently across receivers and time, it is considered that $P(\cap_i Z^i(k+T_j^i)) = \Pi_i P(Z^i(k+T_j^i))$. Moreover, since erasures occur independently across time, it is also that $\Pi_i P(Z^i(k+T_j^i)) = 1 - \epsilon_i^{k+T_j^i}$. Therefore, it may be concluded that $P(\cap_i Z^i(k+T_j^i)) = \Pi_{i \in \chi}(1 - \epsilon_i^{k+T_j^i})$ where $\chi$ is the set of receivers for which the transmitter does not know if the receiver decoded packet $p_j$ successfully.

To exploit the broadcast nature of the wireless medium, it is set the transmitter to use a IEEE 802.11 multicast connection to transmit the data. In its standard form, this type of connection does not provide a feedback connection for receivers to acknowledge received packets. For receivers to be able to send notifications of lost packets, IEEE 802.11 unicast connection is established between each receiver and the transmitter. If poorly managed, the combination of multicast flows with unicast flows could cause the network to collapse due to the unfair way in which multicast and unicast flows can access the medium. More specifically, multicast flows are known not to adjust their contention levels as a function of the network load. To avoid the possibility of such collapse and to prevent collisions between feedback transmissions, receivers send feedback every F packets, where for each receiver $R_i$ the first feedback is sent after $F + \lambda_i$ generated packets, where $\pi_i$ is an offset specific to each receiver.

The performance allowed by the disclosed methods is now discussed through the results obtained from an IEEE 802.11 wireless network testbed. The testbed consisted of one access point and five receivers. The access point transmitted a video encoded with MPEG-2 codec at a constant bit rate of 1375 kbps and a total of 148 seconds of duration. The VLC Media Player (version 1.1.4) was used to handle the streaming of the video to the receiver though a UDP connection. The VLC streamer divides the video in 21040 packets, each with 1344 bytes of size at the IP layer, including IP header. After being generated by VLC, each packet is given a deadline. Since the content is a video stream, the gap between the generation of a packet and its deadline corresponds to the maximum allowed buffering delay at the receiver, before the playback starts. It follows that a packet can only be played at a receiver if it is received before its deadline. Otherwise, the packet is considered to be lost and the receiver skips it. This is likely to cause VLC to produce artifacts in the displayed images and reduce the quality of experience for the end user.

The first evaluation metric that was considered for real-time multicast was the ratio of missed deadlines at each receiver, defined as follows.

Definiton 2 Let $D_i$ denote the number of deadlines missed at $R_i$ and let S denote the number of packets. Then, it is defined $$\text{Ratio of Missed Deadlines for } R_i = \frac{D_i}{S}$$

In the present testbed, it is considered S=21040 video packets.

To measure the efficiency of the transmissions with respect to each of the receivers, it is considered the ratio of received packets that are innovative to the specific receiver, as follows.

TABLE 1

|  | Ratio of Missed Deadlines | Deviation |
| --- | --- | --- |
| Multiple Unicast | $7.906 \times 10^{-4}$ | $8.611 \times 10^{-6}$ |
| M = 1 | $1.432 \times 10^{-6}$ | $1.868 \times 10^{-6}$ |
| M = 2 | $5.440 \times 10^{-5}$ | $1.436 \times 10^{-5}$ |
| M = 3 | $8.487 \times 10^{-5}$ | $2.143 \times 10^{-5}$ |
| M = 4 | $1.695 \times 10^{-4}$ | $4.382 \times 10^{-5}$ |

Definition 3 Let $Inov_i$ denote the total number of bytes of packets received by $R_i$ that were innovative and let $Rec_i$ denote the total number bytes of received packets. It is defined $$\text{Transmission Efficiency for } R_i = \frac{Inov_i}{Rec_i}$$

To evaluate the overhead in terms of transmitted data using the present methods, it is compared the present solutions against a throughput optimal coding scheme, i.e. one that ensures that every transmission is useful to every receiver and, hence, each receiver can decode 21040 video packets upon the correct reception of 21040 transmissions. Examples of such schemes include MDS and Fountain codes, as well as random coding in a sufficiently large finite field. Packets in such schemes do not have any overhead. Therefore, their size is assumed to be the same as the uncoded packets, i.e. 1344 bytes. In such schemes, the sender would stop transmitting only upon the correct reception of 21040 by all the receivers. Hence, the number of transmissions is governed by the last receiver to reach 21040 successful receptions. Therefore, it is measured the overhead in the amount of transmitted data as follows.

Definition 4 Let T denote the number of bytes transmitted by the sender and let S denote the number of source packets, each of size b bytes. Let $Trans_i$ denote the number of sender transmissions until $R_i$ successfully received S of such transmissions. Then, it is defined $$\text{Transmission Overhead} = \frac{T - b \cdot \max_i Trans_i}{b \cdot \max_i Trans_i}$$

In the present testbed, it is that S=21040 and b=1344. Notice that in such ideal schemes, the deadlines of the packets are never taken into account.

The experimentally observed packet erasure ratios were all close to zero, because it is challenging to obtain significant changes in the received signal-to-noise ratio that translate into packet erasures only from simply moving the nodes around. To achieve a wider range of packet erasure ratios, it is induced simulated erasures by dropping extra packets at the receivers, with 10% to 40% of extra randomly erased transmissions that are added to the normal channel erasures. The data was clustered into classes of packet erasure ratios. For each of these classes and for each experiment, 35 independent trials were run and the results were plotted with 95% confidence intervals.

Figure 5:
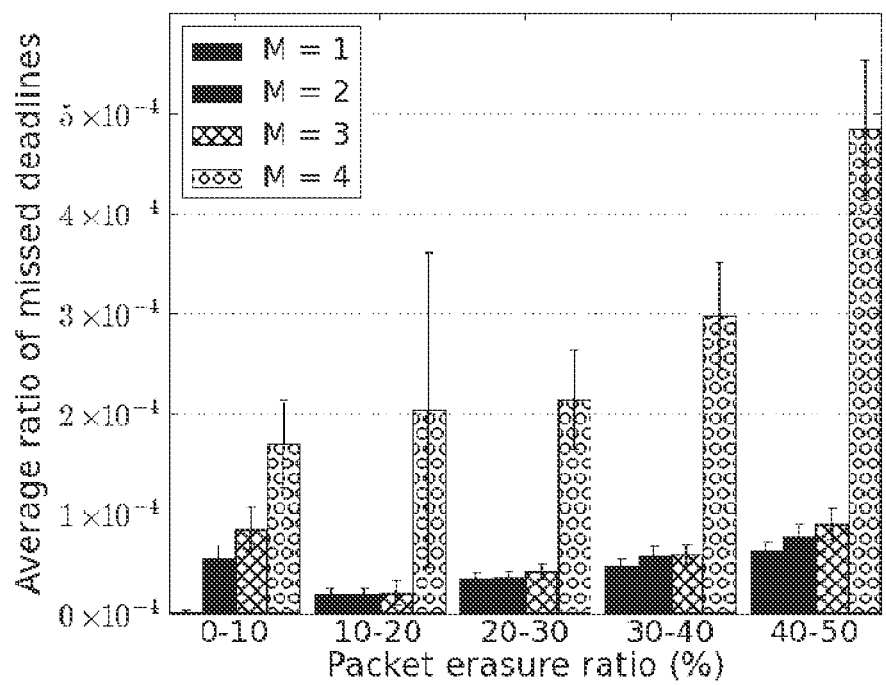
FIG. 5 comprises a graph illustrating the average ratio of packets that missed their deadline for different values of the parameter M, in accordance with embodiments of this invention.

FIG. 5 shows that the methods achieve a low ratio of packets that miss the corresponding deadline. For packet erasure ratios up to 50%, the number of packets that miss the deadline is negligible.

Figure 6:
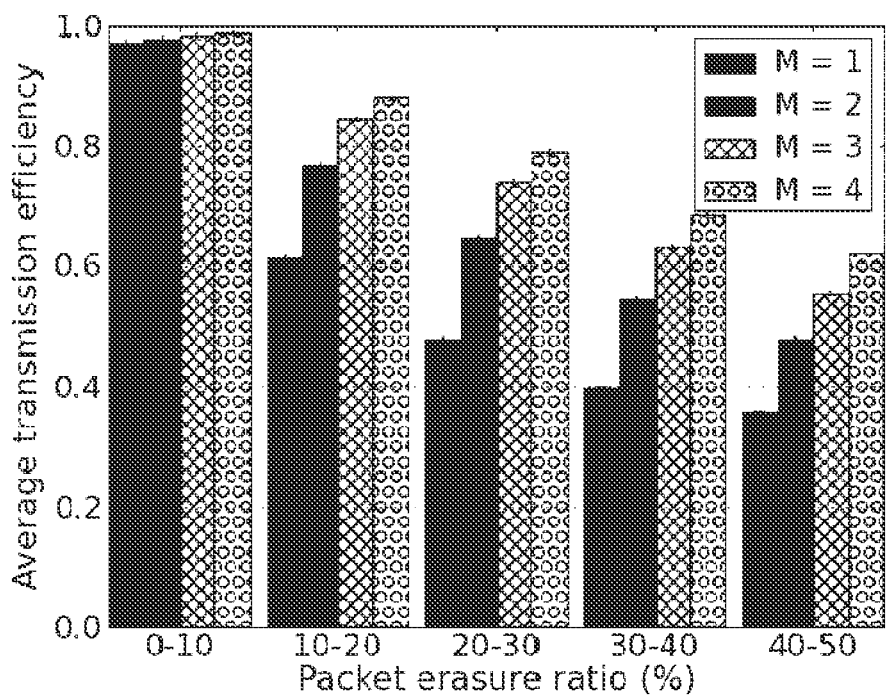
FIG. 6 comprises a graph illustrating the average transmission efficiency for different values of M, in accordance with embodiments of this invention.

FIG. 6 shows that the methods ensure efficient bandwidth usage with small overhead over throughput optimal coding schemes.

Figure 7:
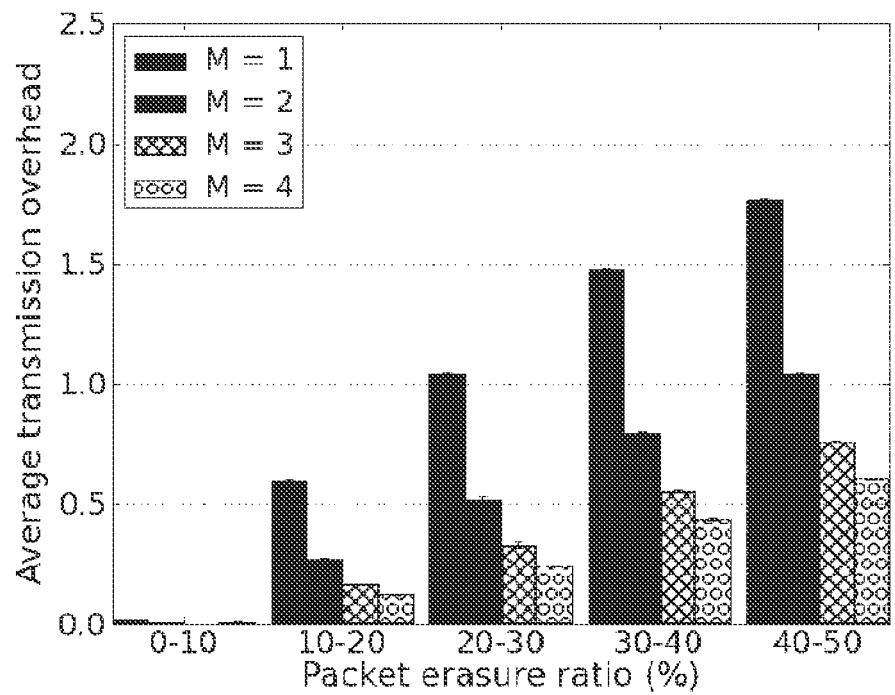
FIG. 7 comprises a graph illustrating the average transmission overhead for different values of M, in accordance with embodiments of this invention.

FIG. 7 plots the variation of the average transmission overhead with the parameter M, which provides a trade-off between the number of broken deadlines and the amount of bandwidth the transmitter is willing to sacrifice. The larger the value of M, the more the transmitter refrains from transmitting recovery packets. Instead, it opts for transmitting packets that are only useful to a larger set of receivers.

Figure 8:
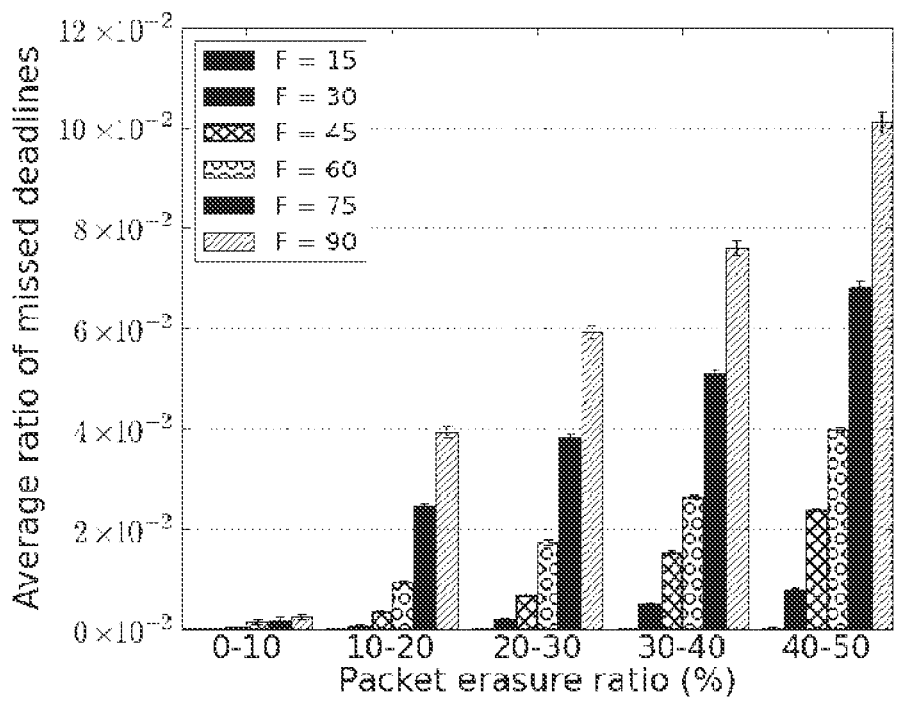
FIG. 8 comprises a graph illustrating the average ratio of packets that missed their deadline for different values of F, in accordance with embodiments of this invention.

FIG. 8 illustrates the impact of the frequency of feedback transmissions on the number of packet deadlines that are broken. Larger values of F lead to a significantly larger ratio of missed deadlines. However, F cannot be set too small, otherwise the network collapses, as discussed above.

Figure 9:
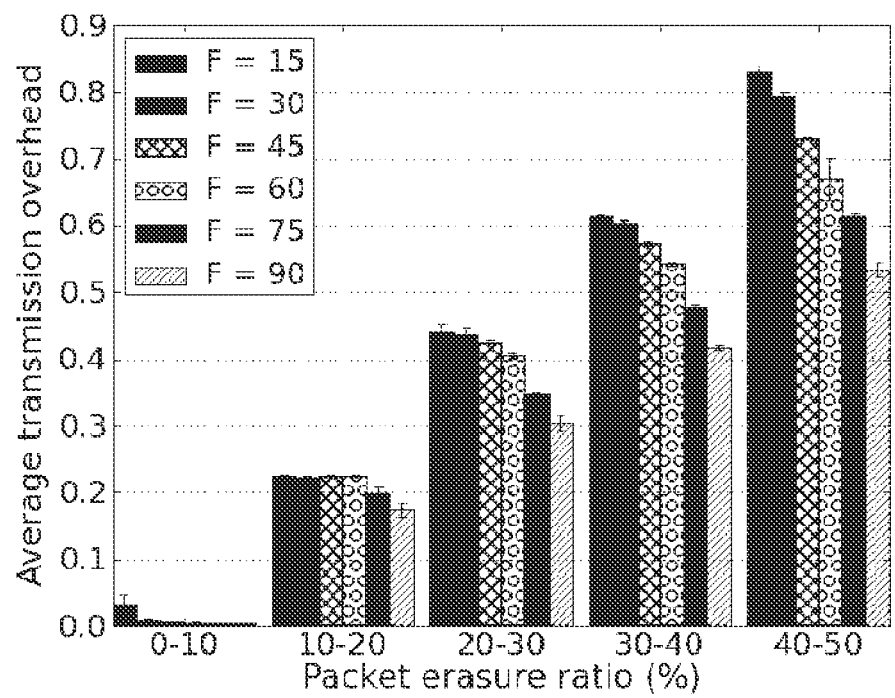
FIG. 9 comprises a graph illustrating the average transmission overhead for different values of F in accordance with embodiments of this invention.

FIG. 9 plots the average transmission overhead for different values of the frequency of feedback transmissions. More frequent feedback leads to smaller overhead albeit at the cost of more missed deadlines.

Figure 10:
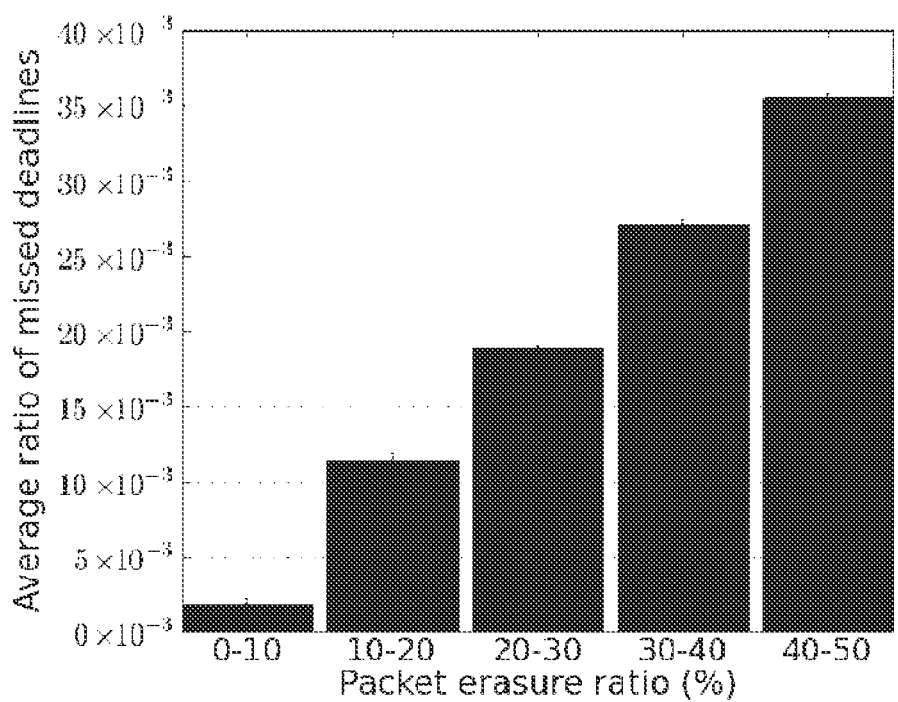
FIG. 10 comprises a graph illustrating the average ratio of packets that missed their deadline for 0.1 second of maximum delay, in accordance with embodiments of this invention.

FIG. 10 plots the variation with the packet erasure ratio of the average ratio of missed deadlines for 0.1 s of maximum delay and F=15. The receivers have few opportunities to send feedback notifications, which leads to a higher number of broken deadlines.

Figure 11:
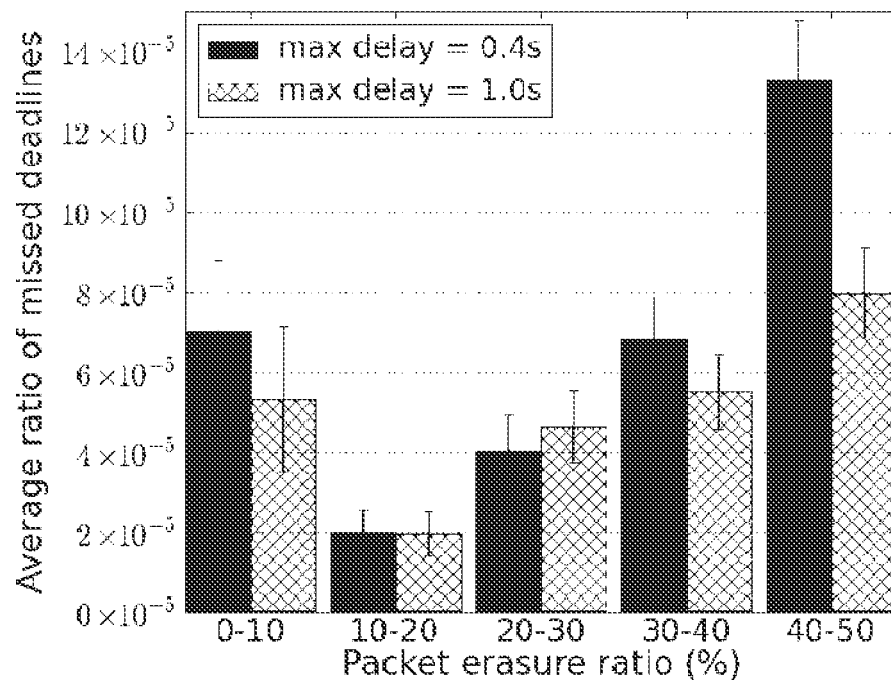
FIG. 11 comprises a graph illustrating the average ratio of packets that missed their deadline for different maximum delay values, in accordance with embodiments of this invention.

FIG. 11 shows the maximum delay allowed in packet delivery has a significant impact in the number of broken deadlines. Nevertheless, FEBER achieves a ratio of broken deadlines of $7 \times 10^{-5}$ with a maximum allowed delay of 0.4 seconds between packet generation at the source and the corresponding delivery at the receiver.

Figure 12:
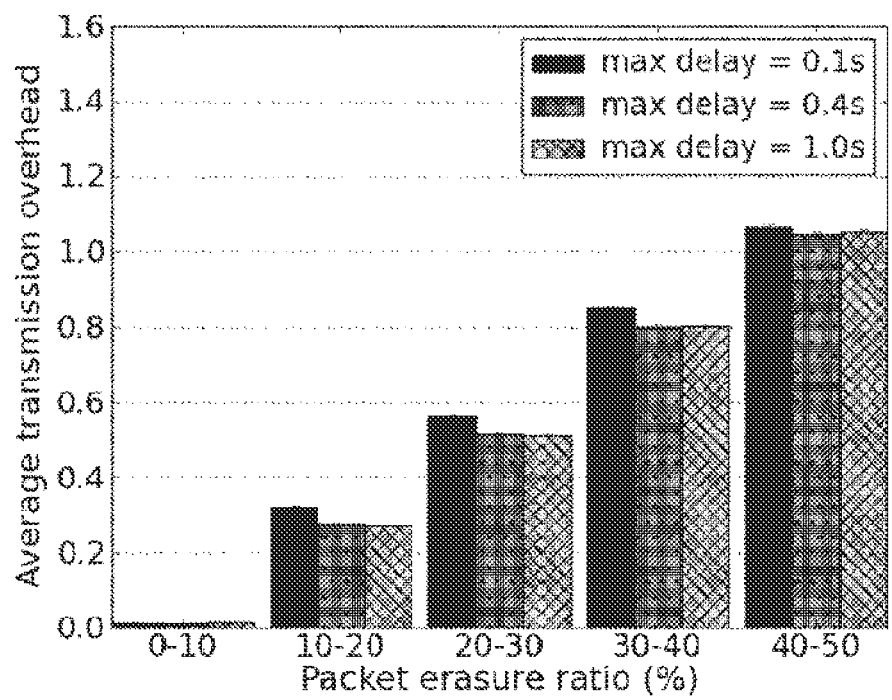
FIG. 12 comprises a graph illustrating the average transmission overhead for different maximum delay values, in accordance with embodiments of this invention.

FIG. 12 illustrates how the average transmission overhead varies with the packet erasure ratio and the maximum delay. Tighter delay constraints lead to a small increase in the experienced transmission overhead.

Table 1 shows that the disclosed multicast methods offer significant improvements over a conventional multiple unicast solution. In contrast with the ratio of $1.4 \times 10^{-6}$ achieved by the disclosed methods, the multiple unicast approach presented a ratio of broken deadlines of $7.9 \times 10^{-4}$.

To understand the impact of M it is useful to recall that a recovery transmission only occurs if the number of receivers that would find such transmission useful is at least M. The role of M is to provide a trade-off between the number of packet that reach the receivers on time and the bandwidth necessary to provide them. To evaluate the impact of M and of coding across packets, it is set the deadline of each packet to be 1 second after its arrival at the sender's buffer, $\alpha=\beta=95\%$, F=15, and it is analyzed the performance obtained for M=1, ... , 4, as a function of the packet erasure ratio.

The results in FIG. 5 show that the present methods can achieve a low ratio of packets that miss their deadline, even for high packet erasure ratios. For M≤3 and for packet erasure ratios from 10% to 40%, the present scheme achieves a ratio of roughly $0.5 \times 10^{-4}$ of the packets with broken deadlines, which translates to less than a single packet out of the 21040. Still for M≤3, for the entire range of packet erasure ratios considered, the present methods are capable of ensuring that less than two packets end up with broken deadlines.

Refraining the transmitter from transmitting at every opportunity by choosing a larger M leads to a larger ratio of missed deadlines. The choice M=4 has a considerable impact on the achieved ratio of missed deadlines. From 0% up to 10% of packet erasure ratio, for M=2 and 3, the present methods achieve higher ratio of missed packets when compared against the ratio of missed packets for the same values of M with packet erasure ratio from 10% up to 40%. This behavior is due to the lack of diversity of packets lost in the receivers, which limits the use of recovery transmissions when M>1.

With respect to the transmission efficiency (Definition 3), the present methods achieve high values, even with high packet erasure ratios, as can be seen in FIG. 6. Clearly, larger values of M lead to an increase in efficiency, specially for packet erasure ratios above 10%. However, as can be observed in FIG. 5, this increase in efficiency comes at the cost of higher ratio of missed deadlines. Therefore, the parameter M provides a trade-off between reliability and bandwidth usage.

The packet erasure ratio has a significant impact on the transmission efficiency, with the increase of this ratio leading to a decrease in the efficiency, due to the high diversity among the requests of the receivers. Nevertheless, even in the worst regime of packet erasure ratios considered (from 40% up to 50%), the choice M=3 leads to less then two packets with broken deadlines out of the 21040, with a transmission efficiency above 50%, which means that the receivers found more than half of the packets useful, on average.

With respect to transmission overhead (Definition 4), FIG. 7 exhibits the obtained results. As in the case of transmission efficiency, in larger packet erasure ratios regimes, it is experienced larger transmission overheads, due to the diversity in the missing packets among the receivers. With respect to the impact of M, increasing M to increase the transmission efficiency naturally leads to a smaller overhead. In the worst packet erasure ratio regime considered, with M=2, the present methods use twice as much bandwidth as throughput optimal coding schemes to achieve less than two packets with broken deadlines, out of the 21040. Recall that these throughput optimal coding schemes do not comply with the delivery of the packets before their deadline is broken.

As mentioned earlier, the present methods rely on a periodic feedback mechanism to estimate the reception status of the receivers, which is then used to perform coding decisions suited to the individual needs of each receiver. To evaluate the impact of the frequency of the feedback transmissions, it is set M=2, the deadline of each packet to be 0.4 seconds and $\alpha=\beta=90\%$, and it is analyzed the performance obtained for F=15, 30, 45, 60, 75, 90, as a function of the packet erasure ratio. In FIG. 8, it can be observed that FEBER is highly influenced by the value of F. Since feedback transmissions are more frequent, smaller values of F present a significantly smaller ratio of broken deadlines. The results obtained for the transmission efficiency were similar for all values of F and, due to space constraints, it is not presented the corresponding plot. In contrast, the impact of F on the transmission overhead is considerable. Larger values of F lead to smaller overhead. However, as depicted in FIG. 8, this comes at a cost of a considerably higher ratio of broken deadlines. Nevertheless, for the worst packet erasure ratio regime considered, for all considered values of F, the achieved transmission overhead over throughput optimal coding schemes is between 0.5 and 0.9.

To evaluate how the maximum allowed delay influenced the performance of the present methods, it is set M=2, $\alpha=\beta=95\%$ and F=15, and analyzed the performance obtained for 0.1, 0.4, 1.0 seconds of maximum allowed delay, as a function of the packet erasure ratio. The maximum delay allowed between packet generation and the corresponding delivery to the application at the receiver has a significant impact in the number of broken deadlines. For a maximum delay of 0.1 seconds, the obtained ratio of missed deadlines, FIG. 10, is significantly higher than the ratios obtained for the other maximum delays considered, FIG. 11. For instance, for packet erasure ratios between 10% and 20%, it is obtained a ratio of $11\times10^{-3}$ broken deadlines for 0.1 seconds of maximum delay, whereas for maximum delay of 0.4 and 1 seconds, the obtained ratio is $2\times10^{-5}$. Notice that, even for high packet erasure ratios, with a maximum delay of 0.4 seconds, it can be obtained a ratio of missed deadlines below $15\times10^{-5}$, which corresponds to less than three packets with broken deadlines, out of the 21040.

FIG. 10 presents higher drop packet ratios when compared against FIG. 11 because for 0.1 seconds of maximum delay, with F=15, receivers are not able to announce the loss of packets before the corresponding deadline is broken. With a video composed by 21040 packets and a duration of 148 seconds, for each 0.1 seconds of maximum delay, the source generates on average less than 15 source packets. Even if the receivers are able to report a loss of a packet on time, this will occur very close to the deadline of the packet, causing the present methods to immediately consider it as a critical packet. Therefore, for 0.1 seconds of maximum delay the present methods require smaller values of F to achieve lower ratios of missing deadlines.

The results obtained for the transmission efficiency were similar for all maximum delay values and, due to space constraints, it is not presented the corresponding plot. Regarding the transmission overhead, FIG. 12 shows that the increase of the maximum delay allowed leads to a smaller transmission overhead. For packet erasure ratios from 40% up to 50%, for any maximum delay value, the present methods use roughly 2 times the transmissions done by throughput optimal schemes to achieve less than three packets with broken deadlines, out of the 21040, for maximum delay of 0.4 and 1.0 seconds.

It is important to notice that the conventional approach to obtain a reliable connection to multiple receivers over IEEE 802.11 networks is to use multiple unicast connections, such that each receiver receives the data through an individual connection. This naturally leads to higher bandwidth consumption, due to the replication of transmitted data. To evaluate how the present methods compare against the multiple unicast approach, it is developed the following experiment. The deadline of each packet was set to be 1 second, $\alpha=\beta=95\%$ and F=15. Then, it is analyzed the performance obtained by the present methods and the performance obtained through a multiple unicast solution. The results in Table 1 show the obtained results. While the multiple unicast approach achieves a ratio of broken deadlines of $790.6\times10^{-6}$, the best ratio experienced by FEBER is $1.432\times10^{-6}$, for M=1. Even for M=4, where the efficiency of FEBER is maximized at the cost of more deadlines broken, the present methods achieve a ratio of broken deadlines of $169.5\times10^{-6}$, more than 4 better than multiple unicast.

The performance can be improved further by improving the efficiency of the computation. The device(s) or computer systems that integrate with the processor(s) may include, for example, a personal computer (s), workstation(s) (e.g., Sun, HP), personal digital assistant (s) (PDA(s)), handheld device(s) such as cellular telephone, laptop(s), handheld computer(s), or another device(s) capable of being integrated with a processor(s) that may operate as provided herein. Accordingly, the devices provided herein are not exhaustive and are provided for illustration and not limitation. References to "a microprocessor" and "a processor", or "the microprocessor" and "the processor", may be understood to include one or more microprocessors that may communicate in a stand-alone and/or a distributed environment(s), and may thus be configured to communicate via wired or wireless communications with other processors, where such one or more processor may be configured to operate on one or more processor-controlled devices that may be similar or different devices. Use of such "microprocessor" or "processor" technology may thus also be understood to include a central processing unit, an arithmetic logic unit, an application-specific integrated circuit (IC), and/or a task engine, with such examples provided for illustration and not limitation. Furthermore, references to memory, unless otherwise specified, may include one or more processor-readable and accessible memory elements and/or components that may be internal to the processor-controlled device, external to the processor-controlled device, and/or may be accessed via a wired or wireless network using a variety of communication protocols, and unless otherwise specified, may be arranged to include a combination of external and internal memory devices, where such memory may be contiguous and/or partitioned based on the application. Accordingly, references to a database may be understood to include one or more memory associations, where such references may include commercially available database products (e.g., SQL, Informix, Oracle) and also proprietary databases, and may also include other structures for associating memory such as links, queues, graphs, trees, with such structures provided for illustration and not limitation. References to a network, unless provided otherwise, may include one or more intranets and/or the internet, as well as a virtual network. References herein to microprocessor instructions or microprocessor-executable instructions, in accordance with the above, may be understood to include programmable hardware.

Unless otherwise stated, use of the word "substantially" may be construed to include a precise relationship, condition, arrangement, orientation, and/or other characteristic, and deviations thereof as understood by one of ordinary skill in the art, to the extent that such deviations do not materially affect the disclosed methods and systems. Throughout the entirety of the present disclosure, use of the articles "a" or "an" to modify a noun may be understood to be so used for convenience and to include one, or more than one of the modified noun, unless otherwise specifically stated. Elements, components, modules, and/or parts thereof that are described and/or otherwise portrayed through the figures to communicate with, be associated with, and/or be based on something else may be understood to so communicate, be associated with, and or be based on in a direct and/or indirect manner, unless otherwise stipulated herein. Although the methods and systems have been described relative to a specific embodiment thereof, they are not so limited. Obviously many modifications and variations may become apparent in light of the above teachings. Many additional changes in the details, materials, and arrangement of parts, herein described and illustrated, may be made by those skilled in the art.

Having described embodiments of the invention it will now become apparent to those of ordinary skill in the art that other embodiments incorporating these concepts may be used. Additionally, the software included as part of the invention may be embodied in a computer program product that includes a computer useable medium. For example, such a computer usable medium can include a readable memory device, such as a hard drive device, a flash memory device, a CD-ROM, a DVD/ROM, or a computer diskette, having computer readable program code segments stored thereon. The computer readable medium can also include a communications link, either optical, wired, or wireless, having program code segments carried thereon as digital or analog signals. Accordingly, it is submitted that the invention should not be limited to the described embodiments, but rather should be limited only by the scope of the appended claims. The above described embodiments are obviously combinable. The following dependent claims set out particular embodiments of the invention.

REFERENCES

U.S. Pat. No. 7,706,365 B2, April 2010, Effros et al.
U.S. Pat. No. 8,068,426 B2, November 2011, Sundararajan et al.
K. Tang and M. Gerla, "Random access MAC for efficient broadcast support in ad hoc networks," in Wireless Communications and Networking Conference, 2000. WCNC. 2000 IEEE, vol. 1, Chicago, USA, September 2000, pp. 454-459.
M.-t. Sun, L. Huang, S. Wang, A. Arora, and T.-H. Lai, "Reliable MAC layer multicast in IEEE 802.11 wireless networks," Wireless Communications and Mobile Computing, vol. 3, no. 4, pp. 439-453, 2003.
J. W. Byers, M. Luby, M. Mitzenmacher, and A. Rege, "A digital fountain approach to reliable distribution of bulk data," SIGCOMM Comput. Commun. Rev., vol. 28, pp. 56-67, October 1998.
D. Vukobratovic, V. Stankovic, D. Sejdinovic, L. Stankovic, and Z. Xiong, "Scalable video multicast using expanding window fountain codes," IEEE Transactions on Multimedia, vol. 11, no. 6, pp. 1094-1104, October 2009.
T. Tirronen and J. Virtamo, "Fountain-inspired erasure coding for real-time traffic," Telecommunication Systems, vol. 48, pp. 219-232, May 2010.
S. Katti, H. Rahul, W. Hu, D. Katabi, M. Médard, and J. Crowcroft, "XORs in the air: Practical wireless network coding," IEEE/ACM Transactions on Networking, vol. 16, no. 3, pp. 497-510, June 2008.
H. Seferoglu and A. Markopoulou, "Video-aware opportunistic network coding over wireless networks," IEEE Journal on Selected Areas in Communications, vol. 27, no. 5, pp. 713-728, June 2009.
R. Costa, D. Munaretto, J. Widmer, and J. Barros, "Informed network coding for minimum decoding delay," in Proc. IEEE Int. Conf. on Mobile Ad-hoc and Sensor Systems, Atlanta, USA, October 2008, pp. 80-91.
D. Nguyen, T. Tran, T. Nguyen, and B. Bose, "Wireless broadcast using network coding," IEEE Transactions on Vehicular Technology, vol. 58, no. 2, pp. 914-925, February 2009.
P. Larsson, "Multicast multiuser ARQ," in IEEE Wireless Communications and Networking Conference, Las Vegas, USA, April 2008, pp. 1985-1990.
J. Barros, R. Costa, D. Munaretto, and J. Widmer, "Effective delay control in online network coding," in IEEE Infocom, Rio de Janeiro, Brazil, April 2009, pp. 208-216.
C. Zhan and Y. Xu, "Broadcast scheduling based on network coding in time critical wireless networks," in IEEE International Symposium on Network Coding (NetCod), Toronto, Canada, June 2010, pp. 1-6.
D. Dujovne and T. Turletti, "Multicast in 802.11 WLANs: an experimental study," in Proceedings of the 9th ACM international symposium on Modeling analysis and simulation of wireless and mobile systems, Terromolinos, Spain, 2006, pp. 130-138.

The invention claimed is:

1. A computer-implemented method in a transmitting node for feedback-based real-time network coding to one or more receivers, the method comprising:
   a. receiving notifications from the one or more receivers that one or more packets were missed (101);
   b. determining the priority level for each packet in a transmit queue (102) by determining if each packet in the transmit queue is considered a critical packet, the determining of the priority level being made as a function of a current time of a transmission of each packet, a deadline of each packet, number of transmitted packets from the transmit queue, a threshold value and the notifications received from the one or more receivers or absence of notifications from the one or more receivers;
   c. determining for each packet in the transmit queue (102) if each packet is a new packet, wherein a packet is considered new if the packet has never been transmitted;
   d. determining a linear combination of packets to transmit from the transmit queue when a critical packet is present in the transmit queue or a new packet is not present in the transmit queue, said determining of the linear combination being a function of the priority level of each packet in the transmit queue (105-108);
   e. producing said linear combination of packets;
   f. transmitting said linear combination of packets when a critical packet is present in the transmit queue or if a new packet is not present in the transmit queue, wherein transmission of said linear combination of packets only occurs if said linear combination decodable by at least a predetermined number of the one or more receivers (109);
   g. transmitting a new packet when a critical packet is not present in the transmit queue and the new packet is present in the transmit queue; and
   h. determining whether a packet is to be removed from the transmit queue as a function of the priority level of the packet, and removing the packet if the packet is to be removed from the transmit queue, or refrain from removing the packet if the packet is not to be removed from the transmit queue.

2. A transmitting node for feedback-based real-time network coding to one or more receivers, comprising:
   a. a memory;
   b. a processor;
   c. a communications interface;
   d. an interconnection mechanism coupling the memory, the processor and the communications interface; and
   e. wherein the memory comprises a computer program comprising computer program code instructions for carrying out the method according to claim 1, when said program code instructions are executed by the processor.

3. The method according to claim 1, wherein determining if each packet in the transmit queue is considered critical further comprises:
   estimating a number of transmission opportunities available until the deadline of each packet; and
   computing a probability that each of the one or more receivers will receive each packet before each packet deadline under the estimated number of transmission opportunities, wherein said computed probability is a function of a number of linear combinations including each packet and enabling a receiver of the one or more receivers to decode each packet, transmitted since a last notification received from the receiver of the one or more receivers.

4. The method according to claim 1, wherein based upon a critical packet being present in the transmit queue, determining a linear combination of packets to transmit from the transmit queue further comprises determining a linear combination including a critical packet that is decodable by all of the one or more receivers that have not decoded the critical packet.

5. The method according to claim 1, wherein based upon a critical packet being present or a new packet not being present in the transmit queue, determining the linear combination of packets to transmit from the transmit queue further comprises determining a linear combination which maximizes a number of end users for which said linear combination is decodable.

6. The method according to claim 1, wherein based upon a critical packet being present or a new packet not being present in the transmit queue, determining the linear combination of packets to transmit from the transmit queue further comprises using an iterative procedure that produces a decodable packet, the iterative procedure comprising:
   setting an initial linear combination to be the packet that maximizes the number of receivers that have not yet decoded the packet,
   finding at each iteration the packet that maximizes the number of receivers for which the current linear combination is decodable,
   adding said packet to the current linear combination, and
   terminating the procedure when the number of receivers for the current linear combination is not greater than an immediately preceding iteration.

7. A computer program comprising computer program code instructions stored on a device or other non-transitory medium for carrying out the method according to claim 1, when said program code instructions are executed in a data processing system.

8. A computer-implemented method in a receiving node of feedback-based real-time network coding from a transmitter, the method comprising:
   a. receiving a linear combination of packets from the transmitter (201);
   b. determining if a packet can be decoded using the received linear combination of packets and one or more previously received linear combinations of packets (205);
   c. decoding the packet if a determination was made that the packet can be decoded or discarding the received linear combination of packets if a determination was made that the packet cannot be decoded;
   d. determining a validity of a priority level of the packet (206), wherein the priority level of the packet is a deadline of the packet, and wherein determining the validity of the priority level of the packet (206) comprises checking if the deadline of the packet has not passed (207), and based upon the priority level of the packet not being valid, discarding the packet;
   e. determining if one or more packets were missed (208);
   f. determining a number of generated uncoded packets at the transmitter since a transmission of a last notification regarding the one or more missed packets; and
   g. determining if a notification should be sent to the transmitter, wherein said determination is made based on the number of generated uncoded packets at the transmitter since the transmission of the last notification; and h. determining if the one or more packets were missed, and sending a notification with identifiers of the one or more packets that were missed, when it is determined that the one or more packets were missed (209).

9. A receiving node for feedback-based real-time network coding from a transmitter, comprising:
   a. a memory;
   b. a processor;
   c. a communications interface;
   d. an interconnection mechanism coupling the memory, the processor and the communications interface; and
   e. wherein the memory comprises a computer program comprising computer program code instructions for carrying out the method according to claim 8, when said program code instructions are executed by the processor.

10. A computer program comprising computer program code instructions stored on a device or other non-transitory medium for carrying out the method according to claim 8, when said program code instructions are executed in a data processing system.

11. A computer-implemented method in an intermediate node of feedback-based real-time network coding from a transmitter and to one or more receivers, the method comprising:
   a. receiving a linear combination of packets from the transmitter (401);
   b. determining whether the received linear combination of packets is linearly independent of one or more previously received linear combinations of packets and therefore conveys new information (402);
   c. determining if a packet can be decoded using the received linear combination of packets and the one or more previously received linear combinations of packets (403);
   d. determining a validity of a priority level of the packet (404-405), wherein the priority level of the packet is a deadline of the packet and wherein determining the validity of the priority level of the packet comprises checking if the deadline of the packet has not passed;
   e. based upon a received packet not conveying new information or if a priority level of the received packet is not valid, discarding the received packet;
   f. determining a linear combination of packets to transmit from a transmit queue (406), wherein said determining the linear combination of packets is a function of the one or more previously received linear combinations and priority levels of the packets of the received linear combination of packets (406-408); and
   g. based upon the received linear combination of packets being linearly independent of previously received linear combinations of packets, transmitting the received linear combination of packets or otherwise discarding the received linear combination of packets (409).

12. An intermediate node for feedback-based real-time network coding from a transmitter and to one or more receivers, comprising:
   a. a memory;
   b. a processor;
   c. a communications interface;
   d. an interconnection mechanism coupling the memory, the processor and the communications interface; and
   e. wherein the memory comprises a computer program comprising computer program code instructions for carrying out the method according to claim 11, when said program code instructions are executed by the processor.

13. A computer program comprising computer program code instructions stored on a device or other non-transitory medium for carrying out the method according to claim 11, when said program code instructions are executed in a data processing system.

* * * * *